United States Patent

Haga

[11] Patent Number: 6,108,461
[45] Date of Patent: Aug. 22, 2000

[54] CONTACT IMAGE SENSOR AND METHOD OF MANUFACTURING THE SAME

[75] Inventor: Hiroshi Haga, Tokyo, Japan

[73] Assignee: NEC Corporation, Japan

[21] Appl. No.: 08/975,082

[22] Filed: Nov. 20, 1997

[30] Foreign Application Priority Data

Dec. 5, 1996 [JP] Japan .................................. 8-325303

[51] Int. Cl.[7] .............................. G06K 9/20; G06K 7/00
[52] U.S. Cl. ......................... 382/312; 358/509; 358/512
[58] Field of Search .................................. 348/260, 261, 348/262, 263, 264, 265, 266, 267, 272, 273, 274, 275, 282, 283; 364/400; 257/91; 358/509, 405; 382/312, 162

[56] References Cited

U.S. PATENT DOCUMENTS

| | | | |
|---|---|---|---|
| 3,982,274 | 9/1976 | Chai | 358/43 |
| 4,558,357 | 12/1985 | Nakagawa | 358/75 |
| 4,656,508 | 4/1987 | Yokota | 358/98 |
| 4,748,680 | 5/1988 | Margolin | 382/43 |
| 4,969,043 | 11/1990 | Pothier | 358/213.28 |
| 5,528,294 | 6/1996 | Jung | 348/249 |
| 5,887,087 | 3/1999 | Tamagawa | 382/312 |

FOREIGN PATENT DOCUMENTS

| | | | |
|---|---|---|---|
| 62-193361 | 12/1987 | Japan | H04N 1/028 |
| 1-158770 | 6/1989 | Japan | H01L 27/14 |
| 1-265661 | 10/1989 | Japan | H04N 1/04 |
| 2-260568 | 10/1990 | Japan | H01L 27/14 |
| 3-13166 | 1/1991 | Japan | H04N 1/028 |
| 4-170847 | 6/1992 | Japan | H04N 1/028 |
| 4-188941 | 7/1992 | Japan | H04N 1/028 |
| 4-207753 | 7/1992 | Japan | H04N 1/028 |
| 6291935 | 10/1994 | Japan | H04N 1/028 |
| 8-191371 | 7/1996 | Japan | H04N 1/028 |

*Primary Examiner*—Jerome Grant, II
*Attorney, Agent, or Firm*—Hayes, Soloway, Hennessey, Grossman & Hage, P.C.

[57] ABSTRACT

A color contact image sensor has a light source for emitting illuminating light, a board supporting a sensor element for photoelectrically converting incident light applied thereto, and a light guide fixed to a surface of the board remotely from the light source. The board has a light guide area for transmitting the illuminating light emitted from the light source and applied to the board into the light guide. The sensor element is positioned for receiving light reflected by a subject to which the illuminating light emitted from the light source and passing through the light guide area and the light guide is applied. A color filter is disposed on the board in either a path of the illuminating light emitted from the light source or a path of the light reflected by the subject.

8 Claims, 8 Drawing Sheets

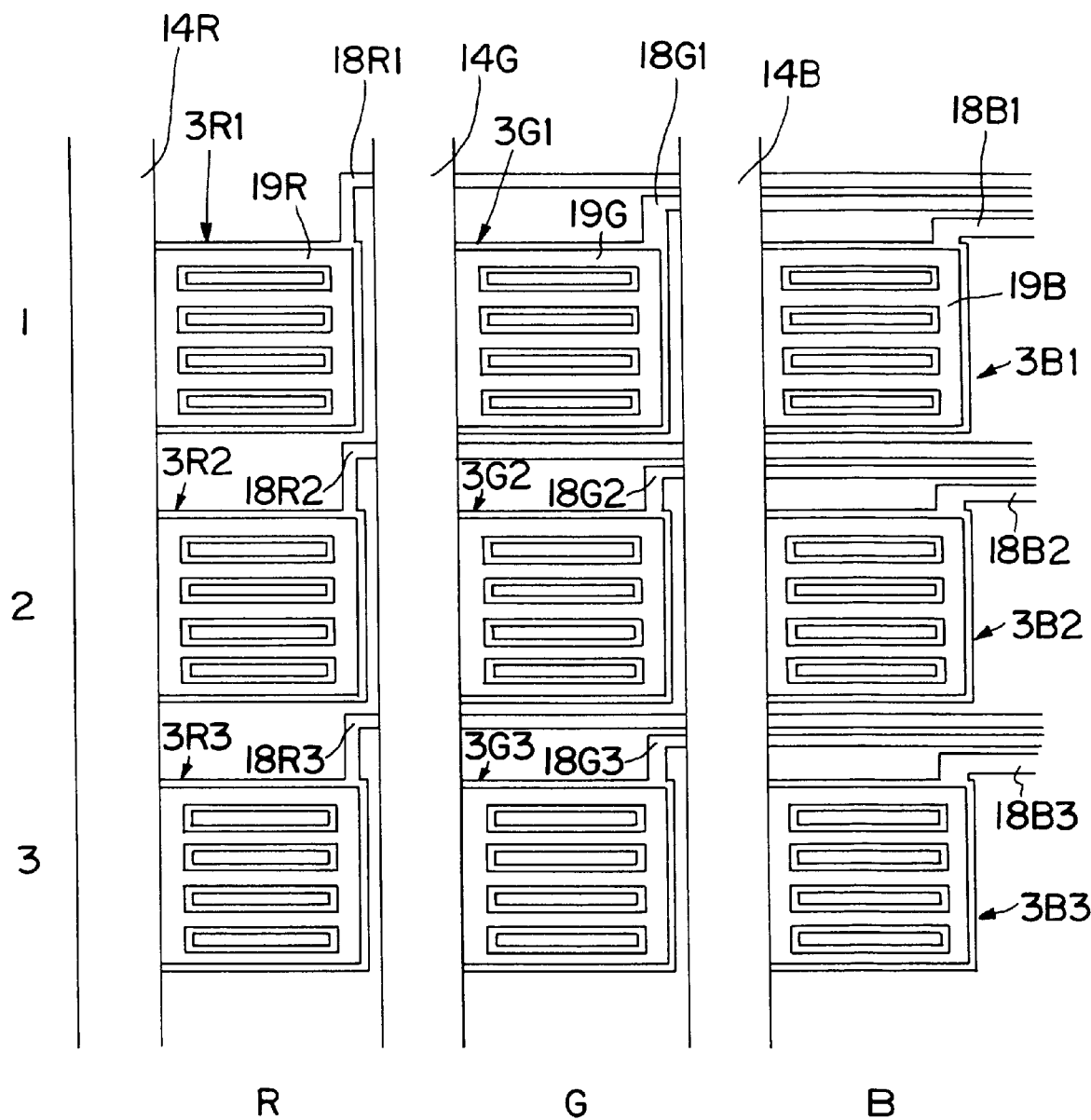
F I G. 7

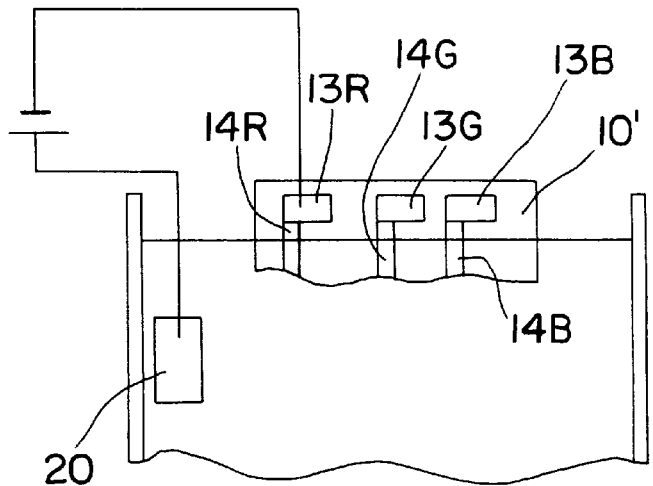
F I G. 8
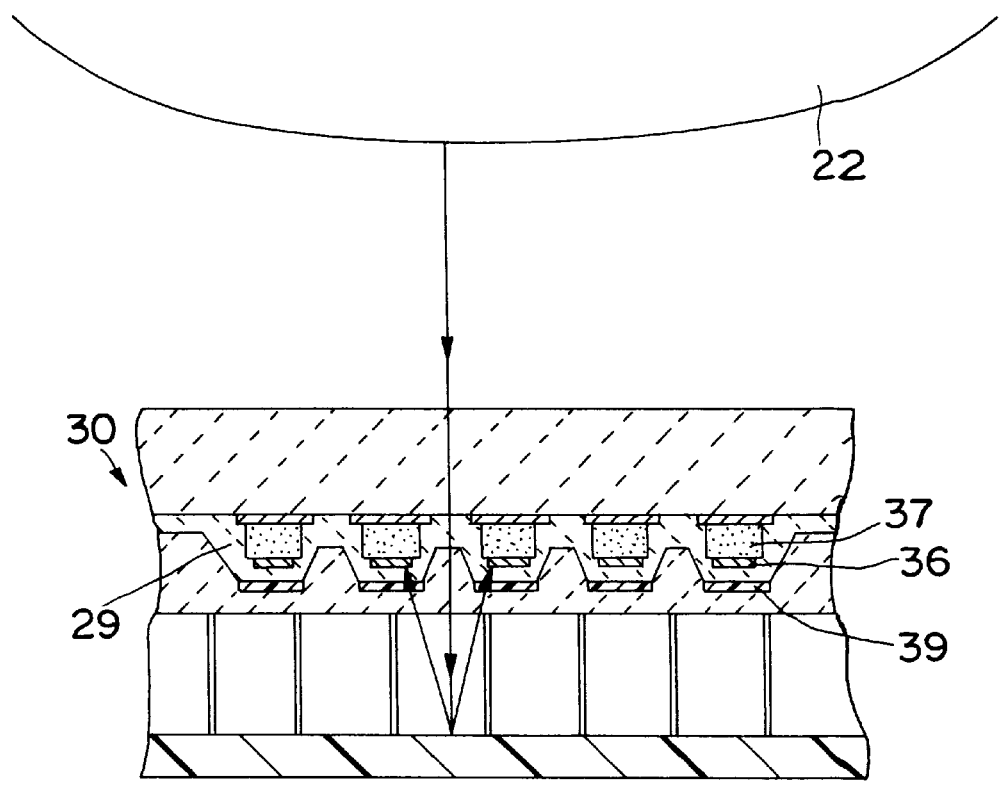
F I G. 9

CONTACT IMAGE SENSOR AND METHOD OF MANUFACTURING THE SAME

BACKGROUND OF THE INVENTION

1. Field of the Invention

The present invention relates to a color contact image sensor comprising an array of sensor elements whose length is equal to the width of the subject to be read, for reading the subject while being held in substantial contact with the subject.

2. Description of the Related Art

Contact image sensors have a length equal to the width of a subject to be read thereby, and operate to read the subject while being held in substantial contact with the subject. Therefore, the contact image sensors are advantageous in that they have an optical path shorter than that of CCDs (charge-coupled devices) and make a reading device small in size through the contact image sensors themselves are relatively large.

Contact image sensors are roughly classified into the following two categories:

In one of the categories, a focusing optical system such as a rod lens array or the like is positioned between an image sensor and a subject for focusing the life-size image of the subject on the sensor surface. Although this type is called a contact image sensor, the image sensor and the focusing optical system need to be spaced from each other and the focusing optical system and the subject also need to be spaced from each other for focusing the image of the subject onto the image sensor. Usually, it is necessary for the image sensor and the subject to be spaced from each other by a distance of 10 mm or greater.

In the other category, a thin glass plate which is about 50 μm thick is attached to the surface of an image sensor, which reads a subject that is held in contact with the glass plate. This type is referred to as a full contact image sensor. While the full contact image sensor doe s not have a focusing optical system, the resolution will greatly be reduced if the subject becomes spaced from the image sensor. Another problem of the full contact image sensor is that the sensor elements produce shadows that make it difficult to illuminate the subject.

To solve the above problems of the full contact image sensor, there has been proposed a full contact image sensor having sensor elements with light guide apertures defined therein and a light guide disposed between the sensor elements and a subject and comprising an array of optical fibers, as disclosed in Japanese laid-open patent publication No. 291935/94.

The disclosed full contact image sensor will be described below with reference to FIG. 1 of the accompanying drawings. As shown in FIG. 1, the full contact image sensor has an LED(light emitting diode) array 102 for emitting illuminating light 104a, a sensor board 110 having an array of sensor elements for photoelectrically converting incident light into electric charges depending on the intensity of the incident light, and a light guide 112 bonded to the sensor board 110 by a transparent adhesive layer 108.

The sensor board 110 comprises a glass substrate 115, an opaque common electrode 116 mounted on the glass substrate 115, a photosensitive layer 117 mounted on the common electrode 116, and a transparent individual electrode 118 mounted on the photosensitive layer 117, jointly making up photodiodes as the sensor elements. The common electrode 116, the photosensitive layer 117, and the individual electrode 118 have a plurality of light guide apertures 107 defined therein. The light guide 112 comprises a plurality of optical fibers 112a each covered with a light absorbing layer 112b, and is bonded to the surface of the individual electrode 118 by the adhesive layer 108. The LED array 102 is disposed on one side of the sensor board 110 near the glass substrate 115.

The illuminating light 104a emitted from the LED array 102 passes through the light guide apertures 107 in the sensor board 110 into the optical fibers 112a, illuminating a subject 105. The light which has illuminated the subject 105 is reflected as reflected light 104b by the subject 105, and the reflected light 104b travels back through the optical fibers 112a and is applied to the photo sensitive layer 117. The photo sensitive layer 117 generates electric charges depending on the intensity of light applied thereto, and stores the generated electric charges. The stored electric charges are then detected at a given time for thereby reading the image of the subject 105.

Image sensors may read a colored subject through color filters placed on their surfaces. Conventional color image sensors have blue (B), green (G), and red (R) color filters associated with respective pixels or color columns. The color filters may be produced by a pigment dispersing process, a dyeing process, a printing process, or the like.

In the contact image sensor disclosed in Japanese laid-open patent publication No. 291935/94, the photodiodes formed by the photosensitive layer and the electrodes generate electric charges are commensurate with the intensity of the light reflected by the subject. Therefore, the disclosed contact image sensor can only detect gray levels, and hence is unable to detect the colors of colored subjects.

One solution will be to attach color filters to the surface of the image sensor. However, if color filters associated with at least respective pixels are combined with a contact image sensor which has light guide apertures in the sensor elements, then the utilization of light by the contact image sensor is lowered, resulting in a poor S/N ratio.

A conventional arrangement in which color filters are combined with a contact image sensor having light guide apertures will be described below.

FIG. 2 of the accompanying drawings shows in cross section the manner in which a subject is being read by a pixel of a contact image sensor having light guide apertures and combined with a color filter. As shown in FIG. 2, illuminating light 154a emitted from a light source 152 passes through a light guide aperture 157, a color filter 169, and an optical fiber 162a and then illuminates a subject 155. The light is then reflected by the subject 155, passes through the optical fiber 162a and the color filter 169, and reaches a photosensitive layer 167. Therefore, the light from the light source 152 passes the color filter 169 twice until it reaches the photosensitive layer 167 after being reflected by the subject 155.

FIG. 3 of the accompanying drawings shows the transmittance of blue (B), green (G), and red (R) color filters that are manufactured by the pigment dispersing process, after the light has passed through the color filters once. FIG. 4 of the accompanying drawings shows the transmittance thereof after the light has passed through the color filters twice. A review of FIGS. 3 and 4 indicates that the utilization of light by the contact image sensor is lowered when the light passes through the color filters twice. Specifically, the utilization of blue (B) light is reduced to 58%, the utilization of green (G) light is reduced to 49%, and the utilization of red (R) light is reduced to 82%. This is because a loss of light occurs each time the light is reflected by interfaces of the color filters and absorbed by the binder of the color filters. While the absorption of light within the color filters can be reduced to some extent by making the color filters thinner, the reflection of light by the interfaces of the color filters is unavoidable. Accordingly, when the light passes the color filters twice, the utilization of light by the contact image sensor is lowered, resulting in a reduction in the level of signals that are generated by the contact image sensor. The reflection of light by the interfaces of the color filters is responsible for the occurrence of stray light, which tends to cause a reduction in the resolution.

SUMMARY OF THE INVENTION

It is therefore an object of the present invention to provide a contact image sensor having light guide apertures defined in sensor elements, the contact image sensor being capable of reading colored images efficiently.

Another object of the present invention is to provide a method of manufacturing a contact image sensor with ease.

According to the present invention, a color contact image sensor has a board on which a sensor element is disposed and which has a light guide area for transmitting illuminating light emitted from a source therethrough, and a light guide fixedly mounted on a surface of the board remotely from the light source. The illuminating light from the light source passes through the light guide area into the light guide, from which the illuminating light is applied to a subject. The illuminating light applied to the subject is reflected, passes back through the light guide, and is applied to the sensor element. A color filter is disposed on the board in either a path of the illuminating light emitted from the light source or a path of the light reflected by the subject. Therefore, the light passes through the color filter only once before it reaches the sensor element. As a result, the utilization of light by the color contact image sensor is relatively high.

The board may include a glass substrate, and the sensor element may comprise an opaque electrode disposed on the glass substrate, a photosensitive layer disposed on the opaque electrode, and a transparent electrode disposed on the photosensitive layer. The color filter may be disposed in the same position as the photosensitive layer with respect to a transverse direction of the board, so that the color filter is disposed in the path of the light reflected by the subject. The color filter may be disposed in the same position as the light guide area with respect to a transverse direction of the board, so that the color filter is disposed in the path of the illuminating light emitted from the light source. If the color filter is disposed in the same position as the photosensitive layer, then the color filter may be disposed on the transparent electrode.

The light source may comprise an array LED light source comprising an array of light-emitting diodes of at least three types having different light-emission spectrums.

A method of manufacturing a sensor board for use in a color contact image sensor according to the present invention comprises the steps of forming an opaque individual electrode in a predetermined pattern including at least one opening, on a surface of a glass substrate, forming a photosensitive layer on the individual electrode, forming a transparent common electrode on the photosensitive layer, immersing the glass substrate with the common electrode formed thereon in a solution with a pigment dispersed therein, and applying a voltage to the common electrode to separate and deposit the pigment on the common electrode.

Since a color filter is formed using the common electrode of the sensor element, the color filter is formed in the path of the light reflected by the subject. Therefore, the sensor board for use in the color contact image sensor can be manufactured with ease.

The above and other objects, features, and advantages of the present invention will become apparent from the following description with references to the accompanying drawings which illustrate examples of the present invention.

BRIEF DESCRIPTION OF THE DRAWINGS

FIG. 7 is a fragmentary plan view of an array of pixels of the color contact image sensor shown in FIG. 5, as viewed from the photodetector surface thereof;

FIG. 8 is a schematic view illustrative of an electrolytic process of producing color filters;

FIG. 9 is a fragmentary cross-sectional view of a color contact image sensor according to a second embodiment of the present invention, the view showing the manner in which a subject is being read by a pixel of the color contact image sensor.

DETAILED DESCRIPTION OF THE PREFERRED EMBODIMENTS

Figure 1:
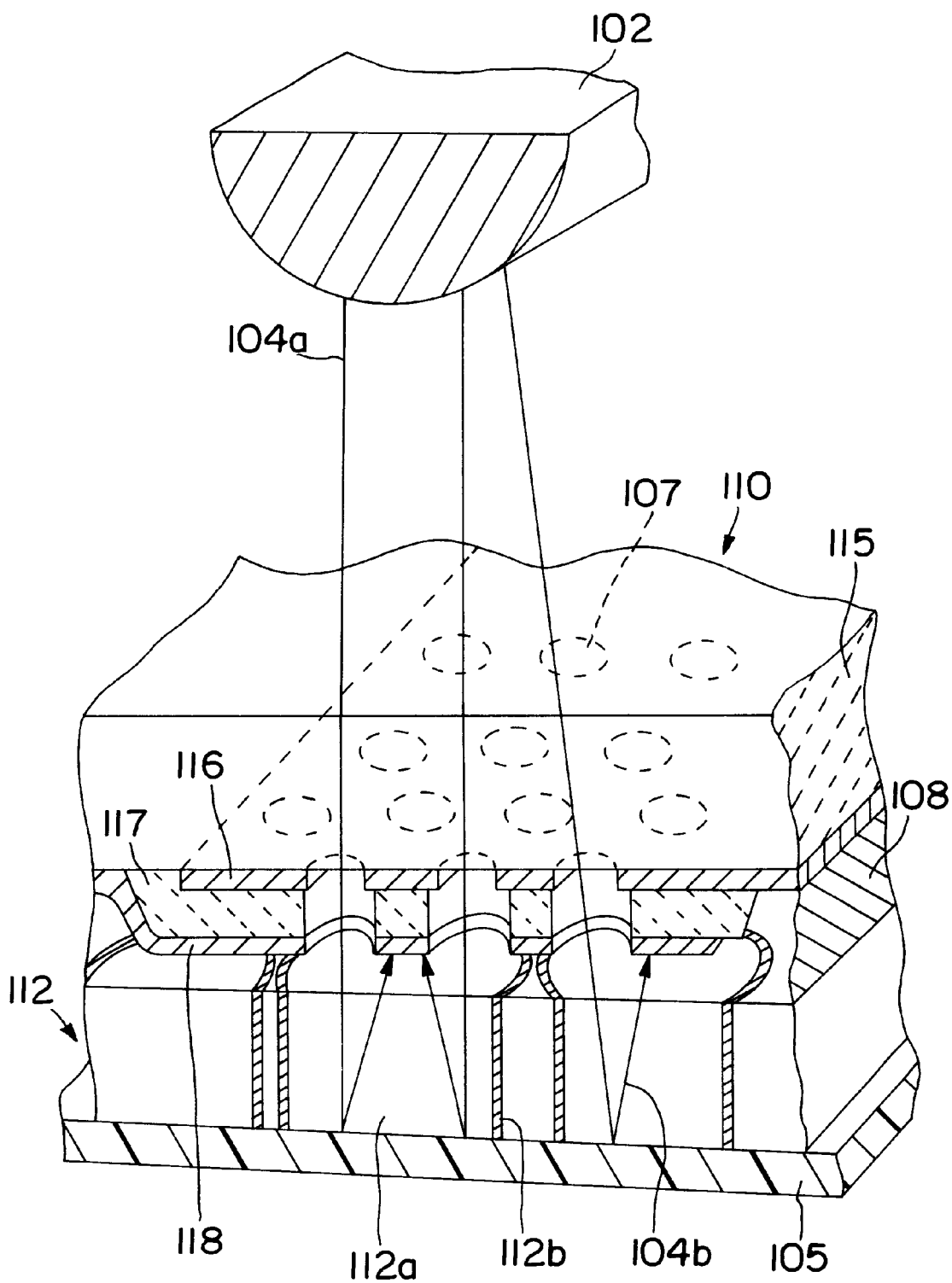
FIG. 1 is a fragmentary sectional perspective view of a conventional contact image sensor having light guide apertures.
Figure 2:
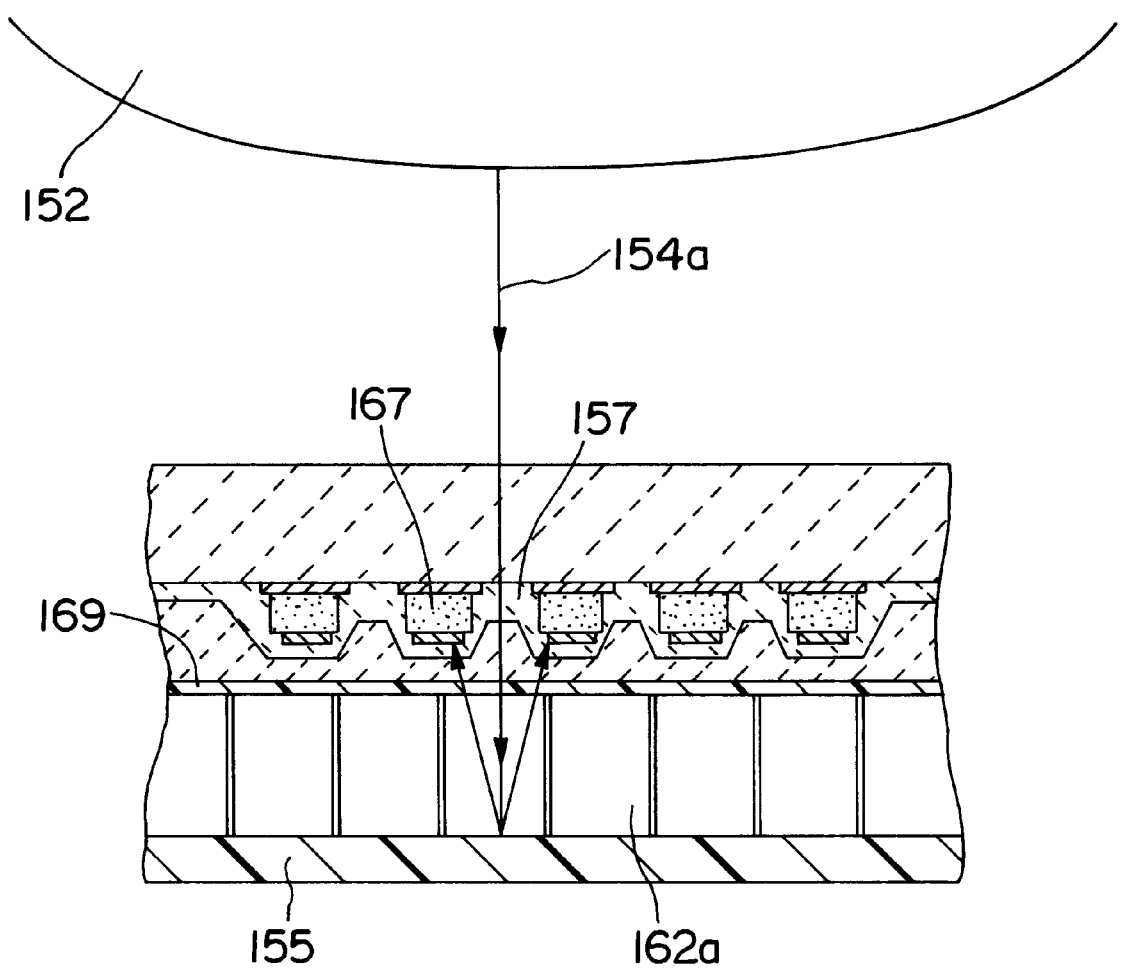
FIG. 2 is a fragmentary cross-sectional view of a conventional color image sensor which comprises the contact image sensor shown in FIG. 1 and color filters.
Figure 3:
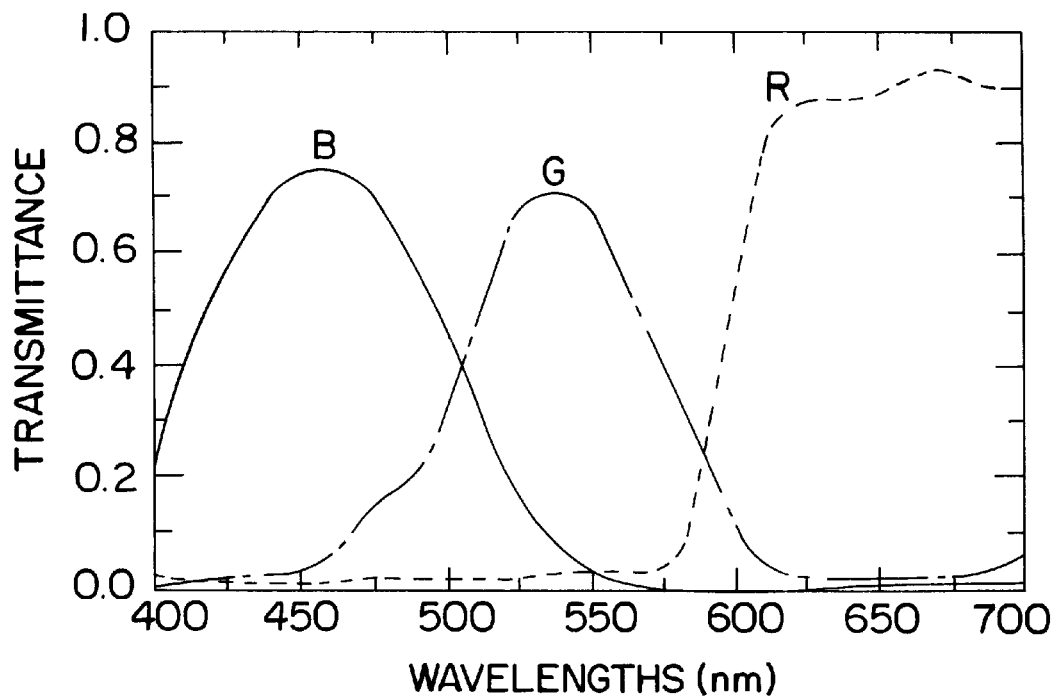
FIG. 3 is a graph showing the transmittance of color filters at different wavelengths of light after the light has passed through the color filters once.
Figure 4:
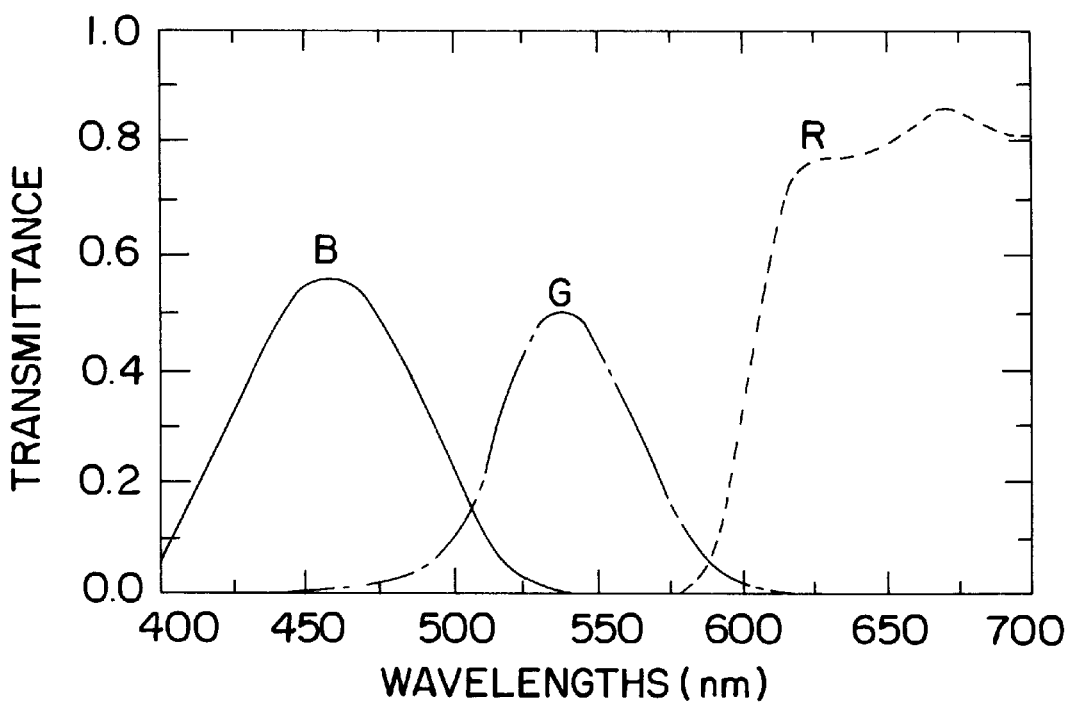
FIG. 4 is a graph showing the transmittance of color filters at different wavelengths of light after the light has passed through the color filters twice.
Figure 5:
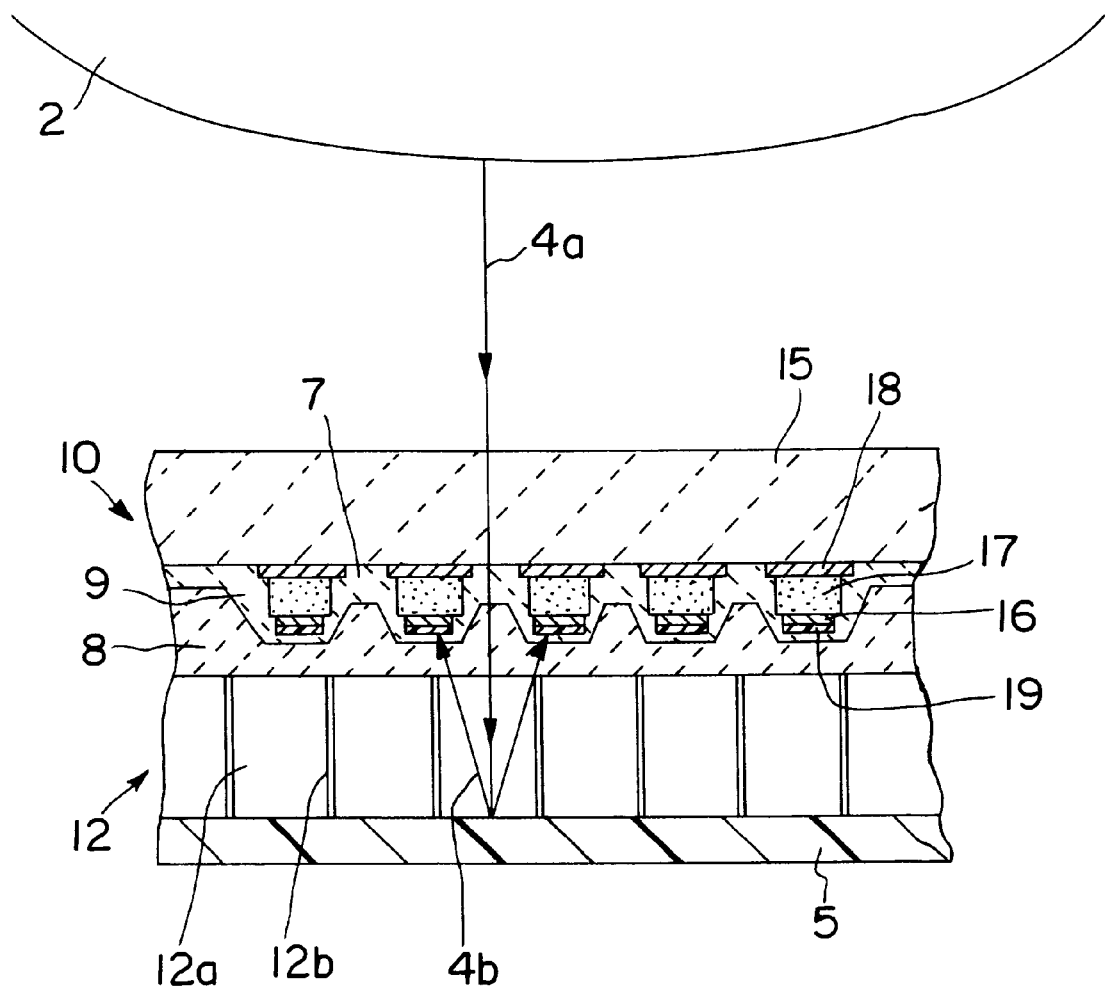
FIG. 5 is a fragmentary cross-sectional view, taken along line V—V of FIG. 6, of a color contact image sensor according to a first embodiment of the present invention, the view showing the manner in which a subject is being read by a pixel of the color contact image sensor.
Figure 6:
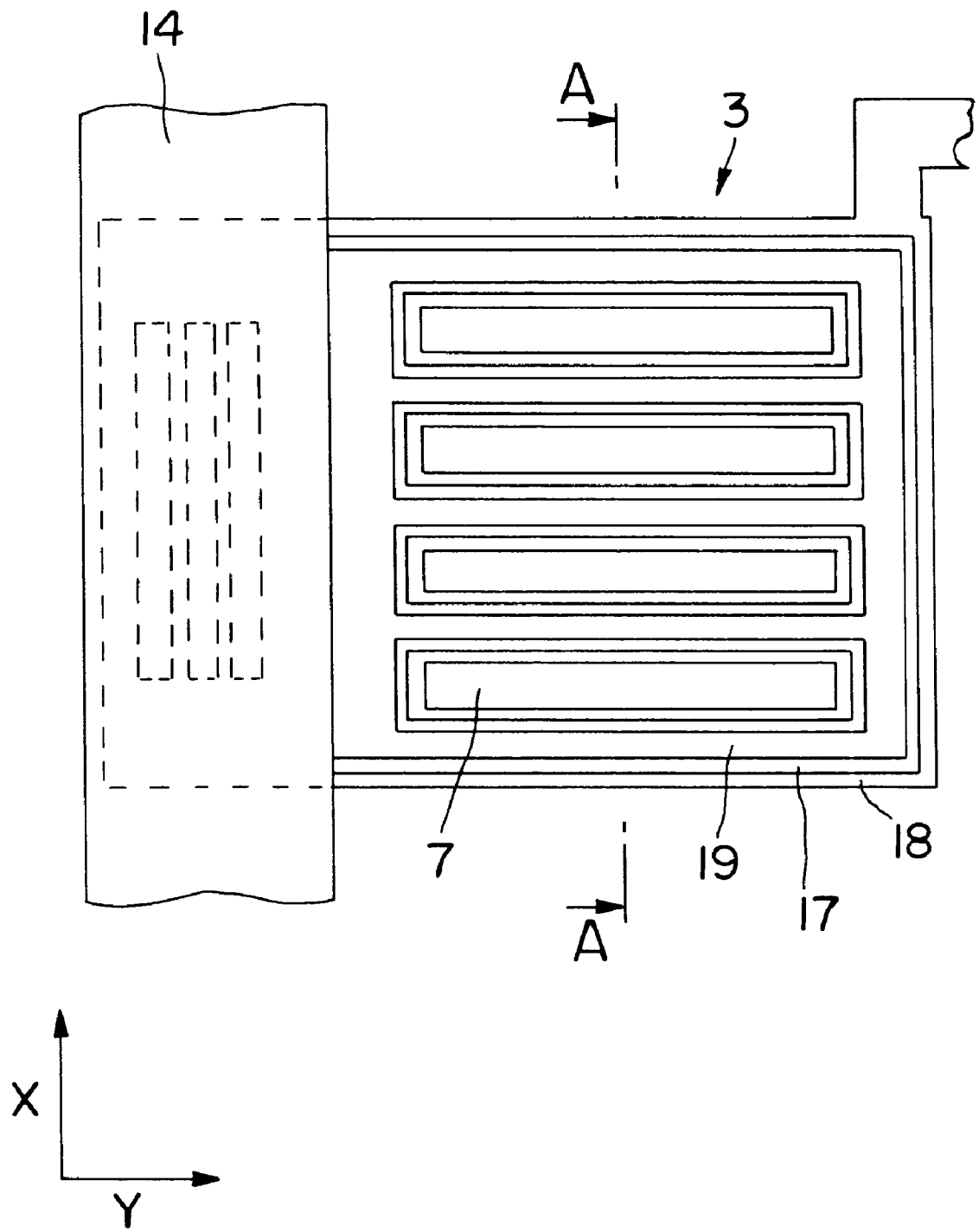
FIG. 6 is a fragmentary plan view of the color contact image sensor shown in FIG. 5, as viewed from a photodetector surface thereof.

1st Embodiment:

FIGS. 5 to 7 show a color contact image sensor according to a first embodiment of the present invention.

The color contact image sensor comprises a line sensor having a resolution of 8 lines/mm, and includes an array of square pixels 3 arranged in a main scanning direction as indicated by the arrow X in FIG. 6 at a pitch of 125 $\mu$m, the pixels 3 having four sides each 100 $\mu$m long. Further, three such arrays of pixels 3 are arranged at spaced intervals in an auxiliary scanning direction, i.e., in the direction indicated by the arrow Y in FIG. 6. The three arrays of pixels 3 are associated with respective red (R), green (G), and blue (B) color filters 19.

As shown in FIG. 5, the color contact image sensor comprises a color LED array light source 2 for emitting illuminating light 4a, a sensor board 10 having an array of sensor elements for photoelectrically converting incident light into electric charges depending on the intensity of the incident light, and a light guide 12 mounted on the sensor board 110.

The color LED array light source 2 comprises an array of red (R), green (G), and blue (B) LEDs for emitting the illuminating light 4a to read color information on a subject 5. The color LED array light source 2 is disposed on one side of the sensor board 10 near the glass substrate 15.

The sensor board 10 has an individual electrode 18 disposed on a lower surface of the glass substrate 15 and comprises a film of chromium having a thickness of 100 nm. The individual electrode 18 extends from each of the pixels 3 and is connected to a pixel selector switch (not shown). The individual electrode 18 is an opaque electrode for preventing the illuminating light 4a from the color LED array light source 2 from being applied to a photosensitive layer 17. As shown in FIG. 6, the individual electrode 18 has four slits serving as light guide apertures 7 each having a width of 10 $\mu$m and a length of 80 $\mu$m. The illuminating light 4a from the color LED array light source 2 passes through the light guide apertures 7 toward the subject 5.

The photosensitive layer 17 is mounted on a lower surface of the individual electrode 18. The photosensitive layer 17 comprises a film of hydrogenated amorphous silicon and a film of boron doped hydrogenated amorphous silicon deposited thereon, and has a total thickness of about 1 $\mu$m. The photosensitive layer 17 is formed by a plasma CVD (chemical vapor deposition) apparatus.

A transparent common electrode 16 made of tin oxide indium is disposed on the surface of the photosensitive layer 17. The common electrode 16 is connected to the other pixels of the same array by a connector electrode 14 shown in FIG. 6.

The individual electrode 18, the photosensitive layer 17, and the common electrode 16 jointly make up a photodiode serving as a sensor element for photoelectrically converting incident light into an electric charge depending on the intensity of the incident light.

A color filter 19 of given color is disposed on the surface of the common electrode 16. The color filter 19 is formed according to a process described later on. The surface of the glass substrate 15 where the color filter 19 is disposed is covered with a protective film 9 of polyimide, thus completing the sensor substrate 10.

The light guide 12 is bonded to the surface of the protective film 9 by an adhesive layer 8. The light guide 12 comprises an array of optical fibers 12a each covered with a light absorbing layer 12b for guiding light incident upon one surface thereof toward the other surface. When reading the subject 5, the light guide 12 is held in close contact with the subject 5. The light guide apertures 7 and the photosensitive layer 17 are positioned such that they are contained together within the cross sections of the optical fibers 12a.

FIG. 7 shows the layout of the pixels 3 as viewed from the photodetector surface of the color contact image sensor. In FIG. 7, the array of pixels connected by a connector electrode 14R serves to read red information, and these pixels 3R1, 3R2, 3R3, . . . are associated with respective red color filters 19R. Similarly, the array of pixels 3G1, 3G2, 3G3, . . . connected by a connector electrode 14G is associated with respective green color filters 19G for reading green information, and the array of pixels 3B1, 3B2, 3B3, . . . connected by a connector electrode 14B is associated with respective blue color filters 19B for reading blue information.

The process of forming the color filters 19R, 19G, 19B will be described below with reference to FIG. 8. In this embodiment, the color filters 19R, 19G, 19B are formed according to an electrolytic process.

First, a sensor board 10' which has been processed until a common electrode is formed is immersed in a colloidal solution with a red pigment dispersed therein. At this time, external connection pads 13R, 13G, 13B on the ends of the connector electrodes 14R, 14G, 14B are kept out of contact with the solution. A positive voltage is applied to an external connection pad 13R of the connector electrode 14R connected to the red array of pixels, and a negative voltage is applied to an electrode 20 that is immersed in the solution. The red pigment is separated and deposited on only those conductors to which the positive voltage is applied, i.e., the common electrodes and interconnections of the pixels of the red array. Thereafter, the sensor board 10' is washed and baked to form a red color filter in regions other than the light guide apertures of the pixels of the red array.

The sensor board 10' on which the red color filter has been formed is then immersed in a colloidal solution with a green pigment dispersed therein. A positive voltage is applied to an external connection pad 13G of the connector electrode 14G connected to the green array of pixels, and a negative voltage is applied to an electrode that is immersed in the solution. The green pigment is separated and deposited on only those conductors to which the positive voltage is applied, i.e., the common electrodes and interconnections of the pixels of the green array. Thereafter, the sensor board 10' is washed and baked to form a green color filter in regions other than the light guide apertures of the pixels of the green array.

Likewise, a blue color filter is formed by immersing the sensor board 10' in a colloidal solution with a blue pigment dispersed therein and applying a positive voltage to an external connection pad 13B of the connector electrode 14B connected to the blue array of pixels, and a negative voltage to an electrode that is immersed in the solution.

After the color filters 19R, 19G, 19B have thus been formed, the protective film 19 is deposited in regions other than the external connection pads 13R, 13G, 13B.

Operation of the color contact image sensor for reading the subject will be described below.

As shown in FIG. 5, the illuminating light 4a emitted from the color LED array light source 2 passes through the light guide apertures 7 in the sensor board 10 into the optical fibers 12a, illuminating the subject 5. The light which has illuminated the subject 5 is reflected as reflected light 4b by the subject 5, and the reflected light 4b travels back through the optical fibers 12a and is applied to the photosensitive layer 17. On its travel to the photosensitive layer 17, the reflected light 4b passes through the color filter 19. When the reflected light 4b is applied to the photosensitive layer 17, the photosensitive layer 17 generates electric charges depending on the intensity of light applied thereto, and the electric charges are stored in the photodiode to which a reverse bias is applied and a capacitor parallel to the photodiode.

Then, the stored electric charges are read as follows: As shown in FIG. 7, when a pixel selector switch connected to an individual electrode 18R1 is turned on, the electric charges stored in the pixel 3R1 flow through the connector electrode 14R, and are detected by a detector circuit (not shown). Similarly, pixel selector switches connected to respective individual electrode 18R2, 18R3, . . . are successively turned on to detect red signals supplied through the connector electrode 14R. This reading process is referred to as a main scanning process. Green and blue signals are similarly detected. The color contact image sensor thus operates as a color line sensor which produces color signals thus detected.

Since the color filter 19 is disposed on only the photosensitive layer 17, the illuminating light emitted from the color LED array light source 2 passes through the color filter 19 only once while it is applied to and reflected by the subject 5 and applied to the photosensitive layer 17. Accordingly, the utilization of light is high, resulting in a low power consumption rate and a better S/N ratio. Because the color filter 19 is formed by applying a voltage to the common electrode 16 within a solution in which a pigment is dispersed thereby to deposit the pigment on the common electrode 16, no microfabrication process is required, and hence the color filter can be formed by a simple manufacturing process.

In this embodiment, the color image sensor with pixel arrays assigned to respective colors has been described. However, the present invention is also applicable to a single-array color image sensor having a single array of pixels which successively produce R, G, B signals. In such a single-array color image sensor, color filters may be formed on desired regions according to the electrolytic process by electrically separating a common electrode for respective colors. Electric charges stored in a photosensitive layer of such a single-array color image sensor may be detected by either a single detector circuit connected to the separated common electrodes outside of the sensor board or detector circuits assigned to the separated common electrodes.

2nd Embodiment:

FIG. 9 shows a color contact image sensor according to a second embodiment of the present invention. As shown in FIG. 9, a color filter 39 is disposed on the surface of a protective film 29. The color filter 39 has the same pattern as a photosensitive layer 37, and is positioned as the photosensitive layer 37 with respect to a transverse direction of a sensor substrate 30. Other details of the color contact image sensor according to the second embodiment are identical to those of the color contact image sensor according to the first embodiment, and will not be described in detail below.

Illuminating light emitted from a color LED array light source 22 passes through the color filter 39 only once while it is applied to and reflected by the subject and applied to the photosensitive layer 37. Therefore, the utilization of light according to the second embodiment is as high as the utilization of light according to the first embodiment.

Inasmuch as the color filter 39 is disposed on the surface of the protective film 29, the color filter 39 cannot be formed using the common electrode 36. According to the second embodiment, the color filter 39 is formed by a pigment dispersion process using photolithographic principles.

The pigment dispersion process for forming the color filter 39 will be described below. After the protective film 29 has been formed, a photopolymer with a red pigment dispersed therein is spin-coated on the sensor board 30. The assembly is thus exposed using an exposure mask which passes exposure light to only those regions of the photosensitive layer 37 which correspond to pixels for reading red information, thereby patterning the color filter 39 as shown in FIG. 9.

The same operation is repeated using a photopolymer with a green pigment dispersed therein and then a photopolymer with a blue pigment dispersed therein. In this manner, the color filters 39 of desired colors can be formed in desired positions. Since the pigment dispersion process allows lines and spaces to be microfabricated at intervals of about 3 $\mu$m, it is possible to form the color filter 39 on only the photosensitive layer 37.

Figure 10:
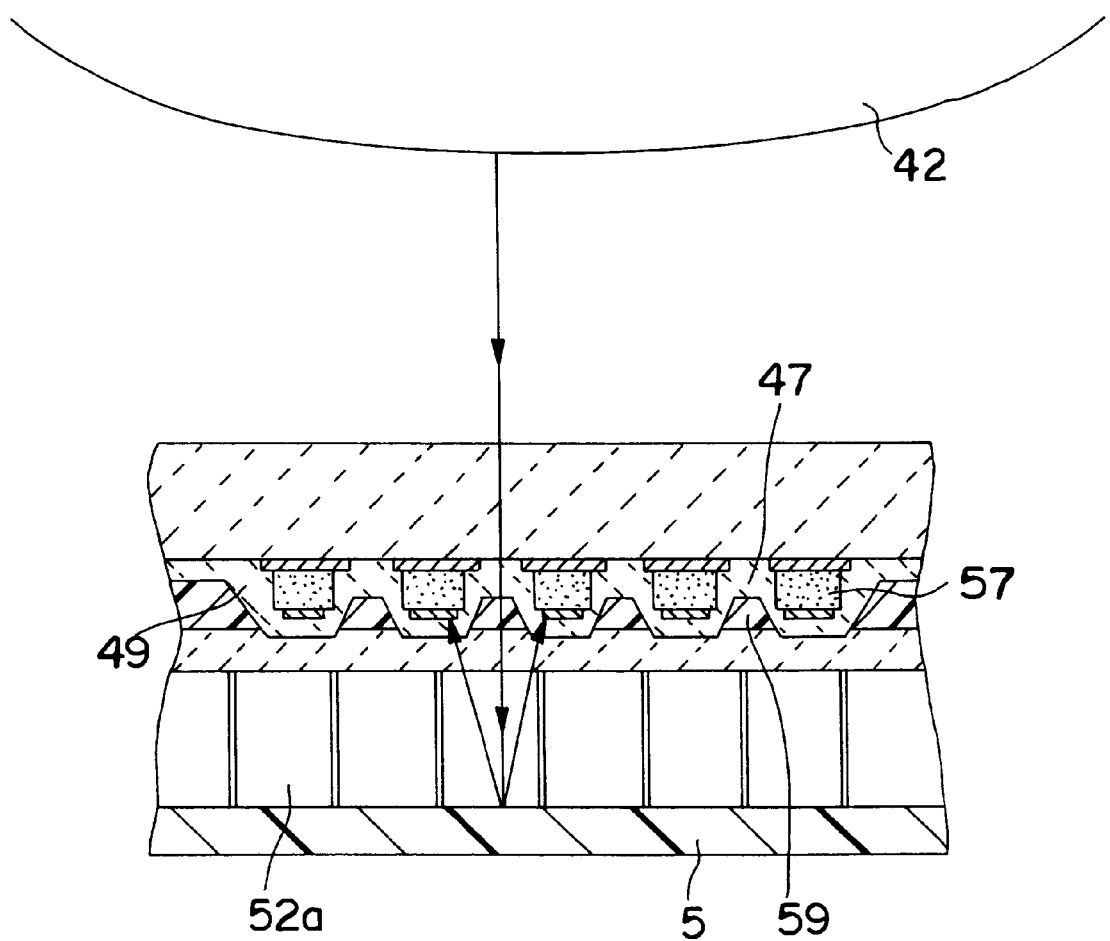
FIG. 10 is a fragmentary cross-sectional view of a color contact image sensor according to a third embodiment of the present invention, the view showing the manner in which a subject is being read by a pixel of the color contact image sensor.

3rd Embodiment:

FIG. 10 shows a color contact image sensor according to a third embodiment of the present invention. As shown in FIG. 10, a color filter 59 is disposed on the surface of a protective film 49 in regions other than a photosensitive layer 57, i.e., in light guide apertures 47 and around the pixel. Other details of the color contact image sensor according to the third embodiment are identical to those of the color contact image sensor according to the first embodiment, and will not be described in detail below. The color filter 59 may be formed according to the pigment dispersion process used in the second embodiment, using an exposure mask having a different pattern from that used in the second embodiment.

In the third embodiment, illuminating light emitted from a color LED array light source 42 passes successively through the light guide apertures 47, the color filter 59, and optical fibers 52a to the subject 5. Light reflected by the subject 5 passes again through the optical fibers 52a, and reaches the photosensitive layer 57. Therefore, the illuminating light emitted from the color LED array light source 42 passes through the color filter 59 only once while it is applied to and reflected by the subject 5 and applied to the photosensitive layer 77. Consequently, the utilization of light according to the third embodiment is as high as the utilization of light according to the first embodiment.

In the third embodiment, the illuminating light from the color LED array light source 42 is separated in color before it is applied to the subject 5. This color-separated illuminating light can be used because illuminated regions of the subject 5 and the corresponding regions of the photosensitive layer 57 are held in a one-to-one correspondence by the optical fibers 52a.

A contact image sensor having a thin glass sheet that is about 50 $\mu$m thick in place of the optical fibers 52a may be constructed as a color contact image sensor according to the present invention.

While preferred embodiments of the present invention have been described using specific terms, such description is for illustrative purposes only, and it is to be understood that changes and variations may be made without departing from the spirit or scope of the following claims.

What is claimed is:

1. A color contact image sensor comprising:

a light source for emitting illuminating light;

a sensor board comprising a glass substrate having a light guide area for transmitting illuminating light emitted from said light source therethrough;

a light guide fixedly mounted on a surface of said board remotely from said light source, for guiding the illuminating light applied to a surface of the light guide to an opposite surface thereof;

a sensor element comprising an opaque electrode disposed on said glass substrate and having a patterned photosensitive layer disposed thereon, and positioned for receiving light reflected by a subject to which the illuminating light emitted from said light source and passing through said light guide area and said light guide is applied, and photoelectrically converting the received light into an electric signal depending on the intensity of the received light; and a similarly patterned color filter disposed on said board in either a path of the illuminating light emitted from said light source or a path of the light reflected by the subject.

2. A color contact image sensor according to claim 1, and comprising a transparent electrode disposed on said photosensitive layer.

3. A color contact image sensor according to claim 1, wherein said color filter is disposed in the same position as said photosensitive layer with respect to a transverse direction of said board.

4. A color contact image sensor according to claim 1, wherein said color filter is disposed on said transparent electrode.

5. A color contact image sensor according to claim 1, wherein said color filter is disposed in the same position as said light guide area with respect to a transverse direction of said board.

6. A color contact image sensor according to claim 1, wherein said light source comprises an array LED light source comprising an array of light-emitting diodes of at least three types having different light-emission spectrums.

7. A method of manufacturing a sensor board for photoelectrically converging incident light into an electric signal dependent on the intensity of the incident light, in color contact image sensor for reading a subject while in substantial contact therewith, wherein said method comprising the steps of:

forming an opaque individual electrode in a predetermined pattern including at least one opening, on a surface of a glass substrate;

forming a photosensitive layer on said individual electrode;

forming a transparent common electrode on said photosensitive layer; and immersing the glass substrate with said common electrode formed thereon in a solution with a pigment dispersed therein, and applying a voltage to said common electrode to separate and deposit the pigment on said common electrode.

8. A method of manufacturing a color contact image sensor, comprising the steps of:

forming an opaque individual electrode in a predetermined pattern including at least one opening, on a surface of a glass substrate;

forming a photosensitive layer on said individual electrode;

forming a transparent common electrode on said photosensitive layer;

immersing the glass substrate with said common electrode formed thereon in a solution with a pigment dispersed therein, and applying a voltage to said common electrode to separate and deposit the pigment on said common electrode;

fixing a light guide for guiding light applied to a surface thereof to an opposite surface thereof, to the surface of said glass substrate with said pigment deposited thereon; and positioning a light source for applying illuminating light to said glass substrate, on a side of said glass substrate remotely from said light guide.

* * * * *